United States Patent [19]

Orloff et al.

[11] Patent Number: 4,629,898

[45] Date of Patent: Dec. 16, 1986

[54] ELECTRON AND ION BEAM APPARATUS AND PASSIVATION MILLING

[75] Inventors: Jonathan H. Orloff, Portland; Lynwood W. Swanson, McMinnville, both of Oreg.

[73] Assignee: Oregon Graduate Center, Beaverton, Oreg.

[21] Appl. No.: 541,719

[22] Filed: Oct. 13, 1983

Related U.S. Application Data

[63] Continuation-in-part of Ser. No. 308,125, Oct. 2, 1981, Pat. No. 4,426,582, which is a continuation of Ser. No. 113,806, Jan. 21, 1980, abandoned.

[51] Int. Cl.$^4$ ................................................ H01J 3/18
[52] U.S. Cl. ................................ 250/396 R; 250/397; 250/398; 324/158 D
[58] Field of Search ................ 250/310, 309, 396 R, 250/397, 398

[56] References Cited

U.S. PATENT DOCUMENTS 3,479,505 11/1969 Liebl ................................. 250/309
4,426,582 1/1984 Orloff et al. .................. 250/396 ML

OTHER PUBLICATIONS

Taylor, "The Effect of Passivation . . . ", *J. Phys. D: Appl. Phys.*, vol. 11, 1978, pp. 2443-2454.

Primary Examiner—Bruce C. Anderson
Assistant Examiner—Jack I. Berman
Attorney, Agent, or Firm—Cahill, Sutton & Thomas

[57] ABSTRACT

A three element asymmetric lens system having a very low chromatic aberration coefficient is used in conjunction with a TFE electron source having an angular intensity of approximately $10^{-3}$ amperes per steradian to achieve precise focusing of the resulting electron beam despite the large energy spread thereof for beam, accelerating ratios in the range from 0.2 to 6.0. In one embodiment, an FI ion source is used in conjunction with the same type of lens system to initially visualize the surface of the integrated circuit. The ion beam then is rapidly focused on and scanned across a small area of passivation over an underlying metal conductor to sputter a hole through the passivation layer to the metal. A secondary electron collecting apparatus detects a large increase in the secondary electron emission when the ion beam reaches the metal. The electron beam then is scanned across the surface of the integrated circuit. The resulting secondary electrons are collected, amplified and input to the intensity control of a CRT, resulting in a display in which the brightness of the location of the milled hole accurately represents the voltage of the metal conductor.

9 Claims, 11 Drawing Figures

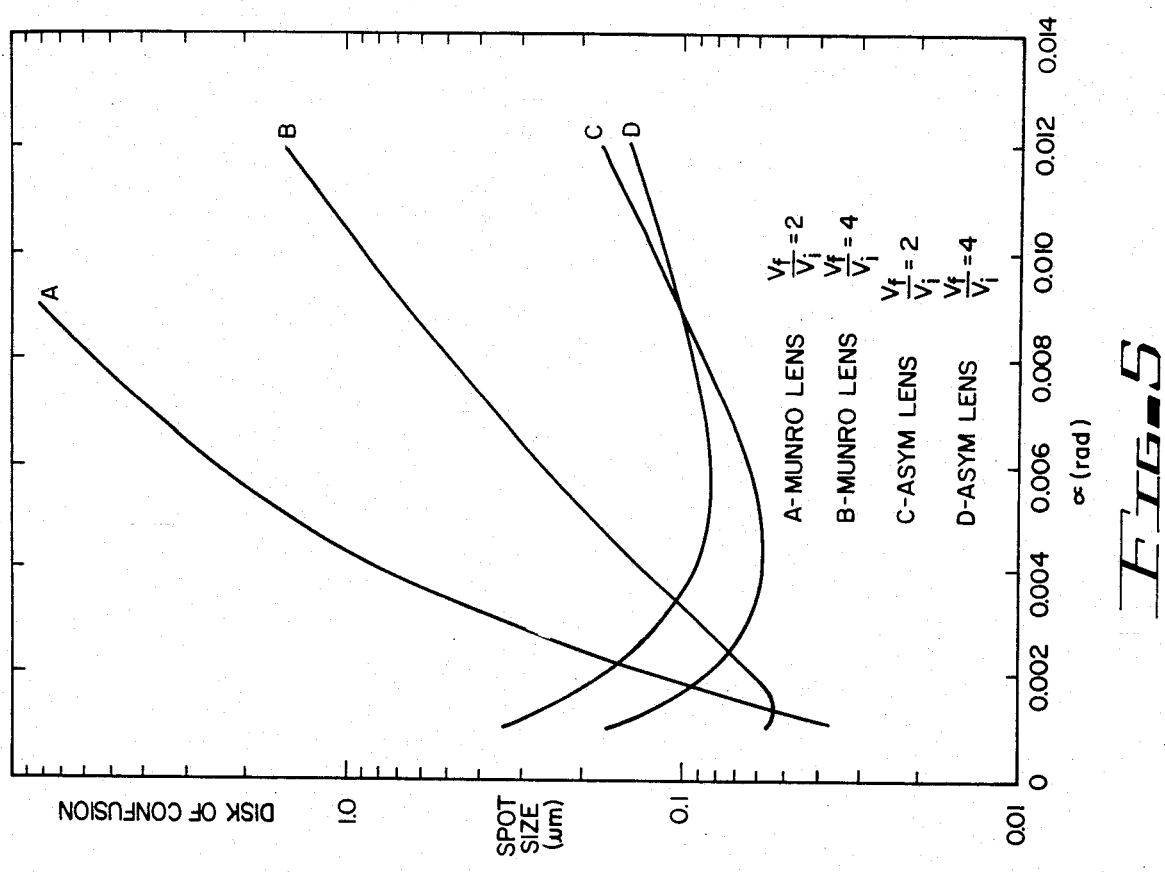
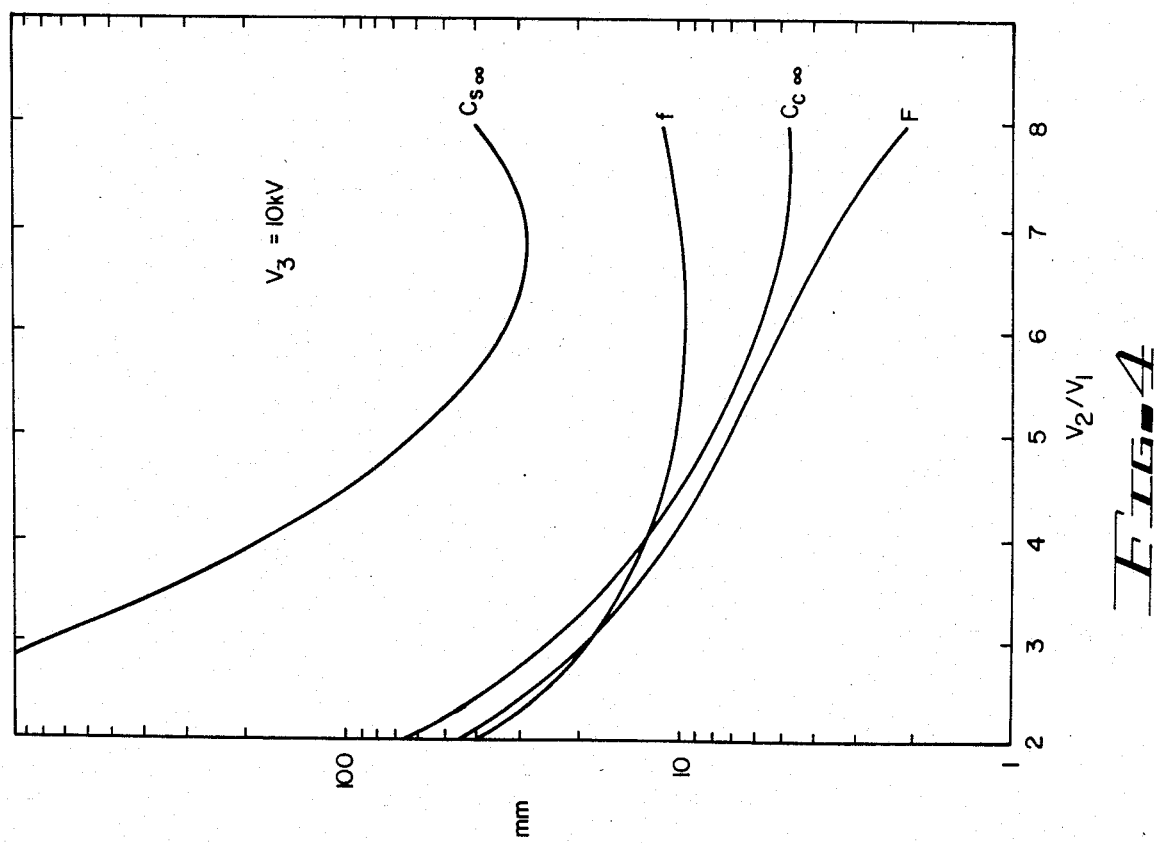

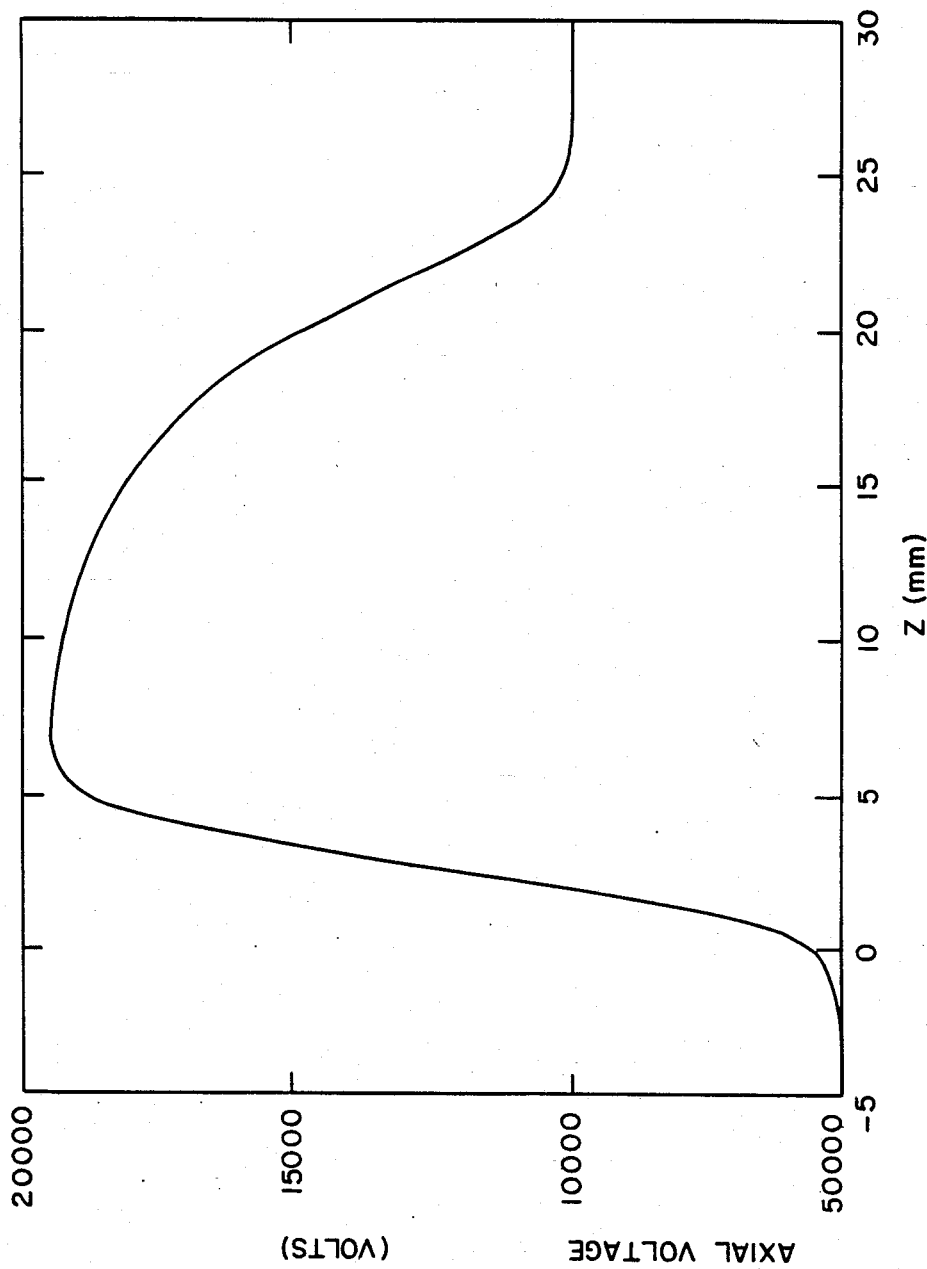

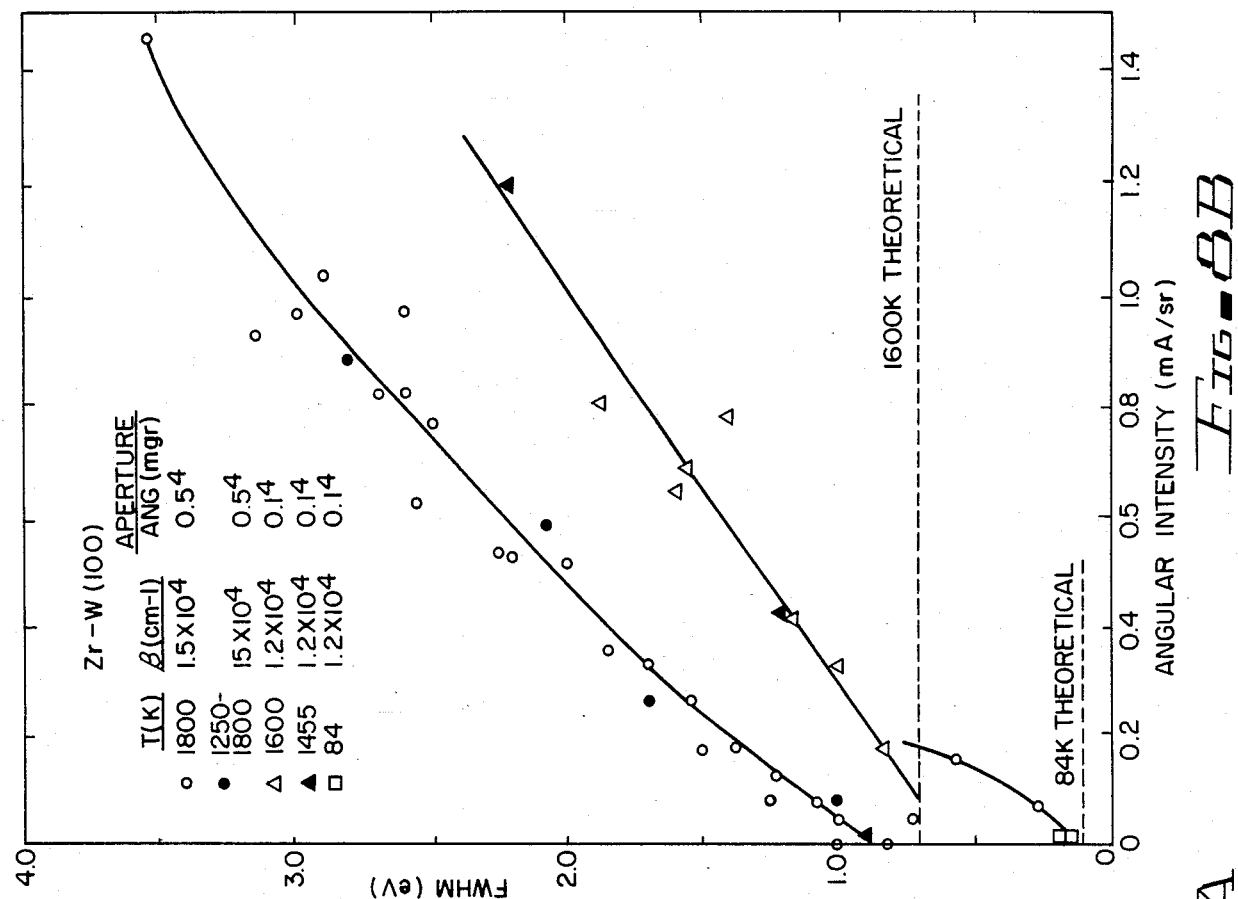
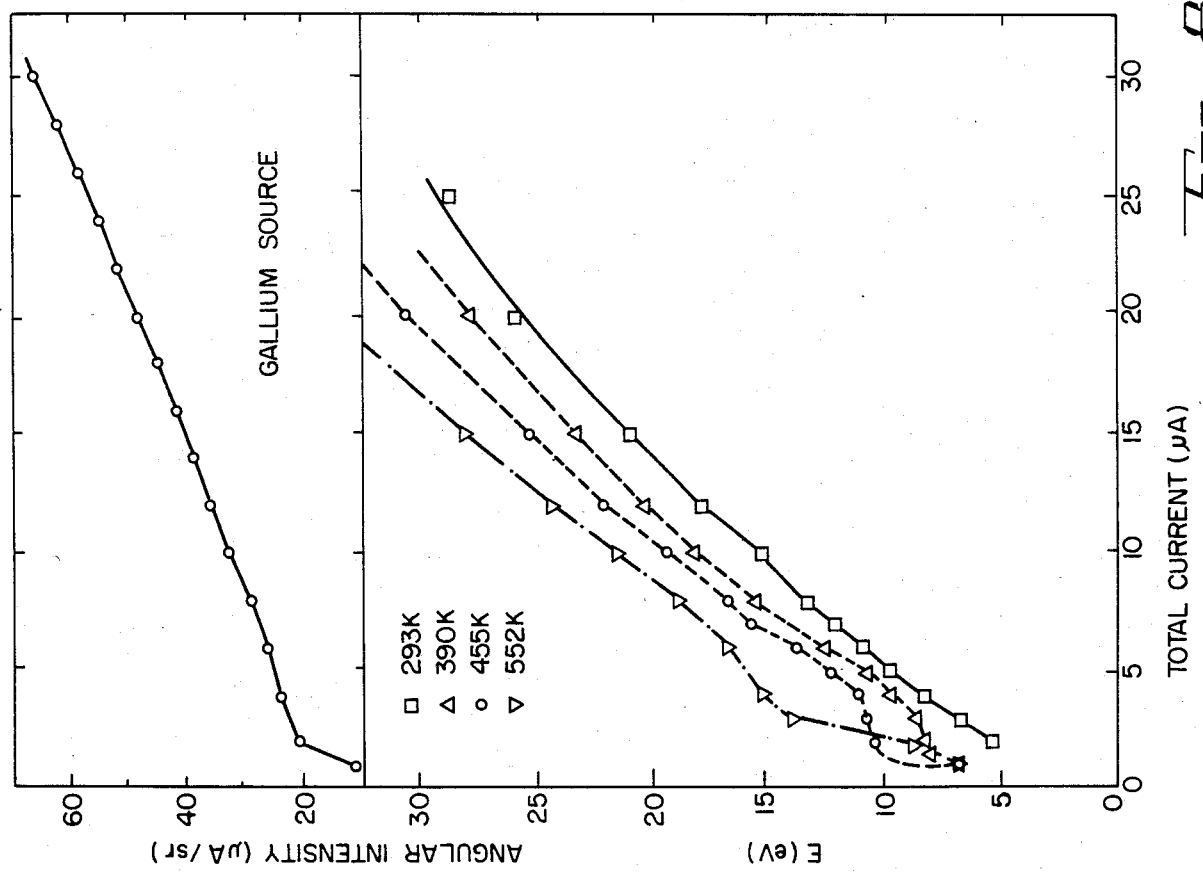
FIG-8A
FIG-8B

ELECTRON AND ION BEAM APPARATUS AND PASSIVATION MILLING

RELATED APPLICATIONS

This is a continuation-in-part of our copending application Ser. No. 308,125, filed Oct. 2, 1981 and entitled "Charged Particle Beam Apparatus and Method Utilizing Liquid Metal Field Ionization Source and Asymmetric Three Element Lens System" issued as U.S. Pat. No. 4,426,582 on Jan. 17, 1984.

BACKGROUND OF THE INVENTION

The invention relates to charged particle guns, and more particularly to field electron and ionization sources and ion guns for producing high current, medium energy ion beams, and to electrostatic lens systems for focusing the beams into small spot areas on a target.

There are numerous applications for ion guns and electron guns for use as microprobes, etc., capable of producing stable, high current, high resolution ion beams precisely focused onto very small "spot areas" of various targets. Gas phase ionization sources have been utilized but are presently incapable of providing focused/high current beams of intermediate energy which are needed for certain applications.

Interest in production of submicrometer focused ion beams for various uses has led to a demand for ion guns capable of producing high beam currents and precisely focusing the beam into very small target spot areas. High current beams, especially ion beams, have very large energy spreads. Chromatic aberration of the electrostatic lens system of ion or electron guns limits the minimum spot size obtainable with an ion or electron gun emitting a beam having a high energy spread. Very bright field emission sources, such as thermal field electron emitters, gas phase field ionization emitters, and liquid phase field ionization emitters are capable of producing submicrometer electron or ion beams with tenths to hundreds of nanoamperes of current. However, ion beams produced by liquid metal field ionization sources have been found to have much greater beam energy spreads ($\Delta E$) than gas phase field ionization sources. The high beam energy spread of beams produced by liquid metal field ionization sources limits the minimum spot size into which an ion beam can be focused by present two-element electrostatic optical lens systems for intermediate beam energies. In order to take advantage of the high level of brightness of such beam sources, it is necessary that their beams be focused by means of electrostatic lenses with low chromatic aberration in order to obtain submicrometer spot sizes. Up to now, no simple, single, electrostatic electron guns are capable of providing beam currents as high as 250 nanoamperes in submicrometer spots for intermediate beam energies in the range from 2,000 to 30,000 electron volts. In situations typical of lithography or surface analysis, where high currents are desired in focused beam spots of approximately 1,000–2,000 Angstroms, the virtual source size has a relatively small effect on the final beam diameter. This is because the large acceptance angles in the electrostatic lens system necessary for high current result in discs of confusion due to chromatic and spherical aberration of the electrostatic lens system. Such discs of confusion are large compared to the virtual source size. In many cases the contribution of the beam diameter of the virtual source can be ignored and the current and beam spot size are determined by the electrostatic lens system alone.

For many applications, a desirable characteristic of an ion or electron gun is that it have the ability to produce a focused beam voltage continuous voltage variability while maintaining a fixed image and object distance.

The advent of very large scale integrated circuits (VLSI) has brought new importance to the use of electron beam probing as a means of function testing and failure analysis. Some present day VLSI circuits "cram" half a million transistors with component detail size less than 2 microns into an area less than 100 square millimeters. Historically, when a circuit fails to meet its specficiations, its circuit elements are checked in order to localize the trouble spot and identify the cause. To do this, fine mechanical probes are placed in contact with appropriate test points where voltage waveforms are measured.

For many present day VLSI circuits, mechanical probes are far too coarse and their capacitances are so large that errors and circuit malfunctions are introduced by the mere act of measurement. Thus, an increasing demand is emerging for "nondestructive" g of VLSI circuits which imposes neither electrical or mechanical stress on the specimen. To meet this demand, two offshoots of the scanning electron microscope (SEM) known as voltage contrast and stroboscopic scanning electron microscopy (SSEM) have been developed.

All materials when bombarded with electrons (greater than 10 electron volts (eV) of energy) emit low energy secondary electrons (0–50 eV) having a characteristic distribution. If the potential of the material is made positive or negative by means of some external voltage source, this secondary electron characteristic distribution curve shifts to lower or higher energies, respectively. In a standard scanning election microscope, this shift in energy distribution with the voltage of the material shows up as a change in image brightness. For a specimen with regions of various surface potentials, the brightness variations can be used to infer voltage variations between the surface regions.

Voltage contrast scanning electron microscopy (VCSEM) allows one to use a low capacitance, high impedance probe to map out the surface voltage differences on different portions of the VLSI chip in a quantitative fashion. By proper phasing of the electron beam scan rate with the device clock signals in an energized device under test, it is possible to display the output video signal from the SEM on a cathode ray tube (CRT) in the form of two-dimensional logic maps superimposed on the IC image.

Within the same instrument concept, a further modification consisting of a high speed beam blanker allows an additional significant measuring function to be performed known as voltage contrast stroboscopic scanning electron microscopy (VCSSEM). This function allows one to follow in real time the shape and amplitude of a high frequency voltage waveform as it propagates through the various elements of a VLSI circuit. A great wealth of information that is of considerable interest when designing and trouble shooting a circuit can be obtained from VCSSEM and VCSEM.

In other applications the standing wave pattern and movement of high speed surface acoustic waves can be followed across a surface. In addition to VLSI applications, a variety of other surface studies can be envisaged with VCSEM. For example, the work function distribution of a nonuniform surface can be mapped with high spatial and voltage resolution by a raster scanning beam. Such a device can be used in a variety of applications such as elucidating grain boundaries on metallurgical specimens and measurement of work function distribution on a complex catalyst.

Unfortunately, quantitative surface potential measurement is complicated by the fact that the secondary yield is not linear with surface voltage. Even if the latter is linearized, the secondary yield is still dependent on surface topography and composition. Another factor that must be taken into account is that adjacent surface potentials have a considerable effect on the secondary yield of the measured area. Ideally, the voltage measured at a particular point by means of voltage contrast should be insensitive to surface topography surface composition, and adjacent surface potentials.

It is an object of the invention to provide a method of producing and focusing a higher current electron beam on a smaller spot area than has been previously possible, despite relatively large energy spreads that are associated with electron beams emanating from sources having high angular intensity.

It is another object of the invention to provide a method and apparatus for simplifying interpretation of voltage contrast images obtained by voltage contrast scanning electron microscopy.

It is another object of the invention to avoid complications in quantitative conductor potential measurement in integrated circuits using VCSEM techniques, which complications are caused by beam charging of passivation material over the conductor.

SUMMARY OF THE INVENTION

Briefly described, and in accordance with one embodiment thereof, the invention provides a three element, physically asymmetric electrostatic lens system for precisely focusing a beam of electrons emanating from a bright point source having an angular intensity of approximately $10^{-3}$ amperes per steradian, the electrons in the beam having a relatively large energy spread in the range of approximately 0.5 to 1.5 eV. The first and third elements of the electrostatic lens system each include an apertured conductive disc which is perpendicular to an axis of the electrostatic lens system. The axis of the lens system passes through the centers of the apertures of the first and third elements. The second element is cylindrical, and is disposed along the axis between and spaced from the first and third elements. The second element has a cylindrical aperture aligned with the axis of the lens system. The cylindrical aperture of the second element includes a first portion having a first diameter and a second portion having a second diameter, the second diameter being approximately six times the first diameter. The dimension of the second portion of the second element along the axis of the lens system is approximately four times as large as the corresponding dimension of the first portion thereof.

The asymmetric configuration of the second element causes the axial potential of a charged particle beam passing through the electrostatic lens system to be gradually reduced with distance along the axis as the beam passes through the second portion of the second element, thereby minimizing chromatic aberration of the electrostatic lens system.

Voltage conductors apply a voltage to the emitter to maintain the emitter at a predetermined magnitude above the onset voltage magnitude at which field emission of electrons begins. These voltage conductors also conduct current through an emitter support to heat the emitter to a predetermined temperature. The predetermined temperature and the predetermined voltage are selected to produce an electron beam with an energy spread less than a preselected value, enabling the electrostatic lens system to focus the ion beam into a predetermined target spot size.

The low chromatic aberration of the asymmetric three-element electrostatic lens system also permits an electron beam of higher angular intensity, and hence, of substantially higher beam higher current, to be focused into the predetermined spot size than any prior electrostatic lens system for beam energies in the range from 2,000 to 30,000 electron volts and for beam acceleration ratios in the range from 0.2 to essentially the same system tem can be use with a liquid metal ionization the same voltage range.

In another described embodiment of the invention, the three element electrostatic lens system is utilized in conjunction with a field ionization source to accurately focus an ion beam onto the surface of an integrated circuit covered by a passivation layer immediately overlying a metal conductor, the voltage of which is desired to be accurately measured. The ion beam is scanned across a small area, causing sputtering of the passivation material, which is typically a glass layer, until a small hole has been milled through the passivation layer to the underlying metal conductor. Where the ion beam strikes the underlying metal conductor, a copious amount of secondary electron emission therefrom occurs. The secondary electrons are collected by a detecting apparatus, the output of which is coupled to modulate the intensity of the image of a cathode ray tube, indicating the high amount of secondary electron emission and indicating that the hole has been milled entirely through the passivation to the metal conductor. Since the three element electrostatic lens system and field ionization source, in conjunction with appropriate circuitry for focusing the ion beam and scanning it over the surface of the integrated circuits functions as an ion microscope, it can be used, in conjunction with a properly synchronized connection to a cathode ray tube to visualize the surface of the integrated circuit and effectuate accurate location of the hole to be milled through the passivation layer. After the hole has been milled to the underlying conductor, the integrated circuit is subjected to a scanning electron beam generated by the above described electron gun. Secondary emission of electrons from the metal conductor occurs, and these electrons pass through the milled hole. The non-linear complications associated with charging of the passivation by the scanning electron beam are thereby avoided. This facilitates accurate quantification of the voltage on the conductor.

BRIEF DESCRIPTION OF THE DRAWINGS

FIG. 4 shows a set of curves showing characteristics of the electrostatic optical system of FIG. 1.

FIG. 5 shows a set of curves useful in comparing a two element electrostatic optical system and the three element asymmetric electrostatic optical system of FIG. 1 for a particular intermediate beam energy.

FIG. 6 is a curve of the axial beam voltage V for the electrostatic optical system of FIG. 1.

FIG. 8A is a graph useful in explaining the relationship between angular intensity of a high brightness field ionization source and energy spread E of the resulting ion beam.

FIG. 8B is a graph useful in explaining the relationship between angular intensity of a high brightness TFE electron source and energy spread $\Delta E$ of the resulting ion beam.

DESCRIPTION OF THE INVENTION

Figure 1:
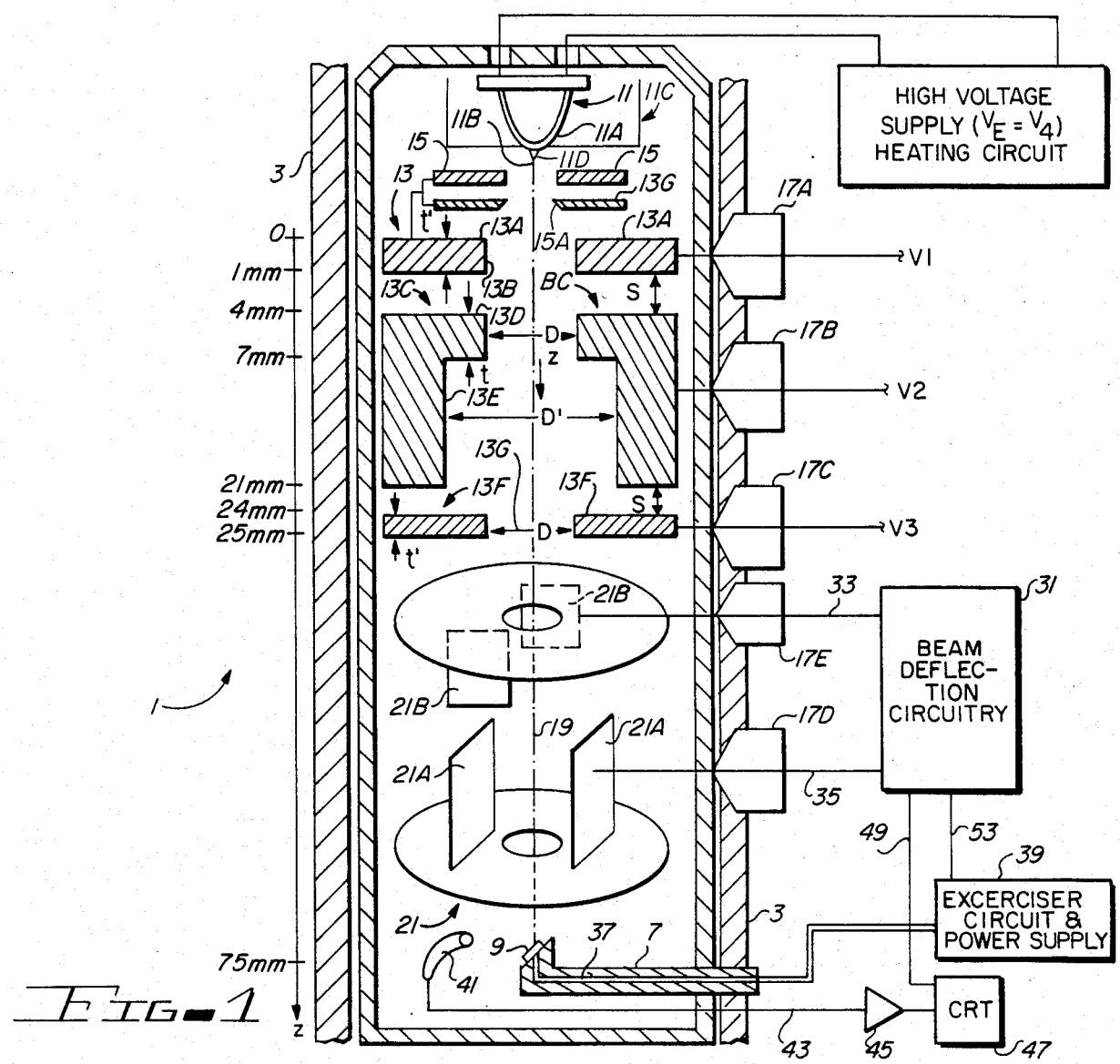
FIG. 1 is a schematic section view of an ion gun including a liquid metal field ionization emitter and a physically asymmetric, voltage asymmetric three element electrostatic optical system, or an electron gun using the same optical lens system.

Referring now to FIG. 1, ion gun 1 includes a TFE (thermal field electron) source 11 and a physically asymmetric, voltage asymmetric electrostatic optical system 13, a deflection system 21, and a target 9.

Source 11 includes an emitter support 11A and an emitter 11B. Source 11 can be either a TFE (thermal field electron) source or an FI (field ionization) source, depending on whether an ion gun or an electron gun is desired. Emitter support 11A is made of 127 micron diameter tungsten wire, through which current is forced to resistively heat emitter 11B. For an ion source, emitter 11B is formed of 127 micron diameter drawn tungsten wire which is spot welded to loop 11A. Emitter 11B then is coated with suitable liquid metal, such as gallium.

The conically shaped point of ion emitter 11B is electrochemically etched, and has a cone half angle of 23 degrees (plus or minus 2 degrees) and a radius of 5 microns (plus or minus 2 microns). Alternately, if an electron gun is desired, emitter 11B is configured suitably of <100>single crystal tungsten or zirconium-doped <100>single crystal tungsten, as subsequently explained.

Temperature measurement is accomplished by spot welding 76 micron tungsten leads (not shown) on a section of the filament loop supporting the emitter. Filament resistance is measured and utilized to determine the filament temperature.

The emitter structure 11 is surrounded by a suppressor shield 11C, in which there is an aperture 11D whose diameter is approximately 0.5 millimeters for an electron gun and approximately one millimeter for an ion gun. Emitter 11B protrudes approximately 0.5 millimeters through aperture 11D for an electron gun and protrudes approximately one millimeter through aperture 11D for an ion gun. Shield 11C is maintained at a potential between +2000 volts and −2,000 volts with respect to emitter 11B.

The above described elements are supported within a vacuum chamber 5. Vacuum chamber 5 is supported by support 3. Target 9 is supported on support 7. Support 7 extends through the wall of vacuum chamber 5 to permit alignment of target 9 with the electron beam emitted from emitter 11B and focused by the asymmetric electrostatic lens system 13. The electron beam is focused generally along dotted line 19 to target 9.

An extractor ring 15 having an opening 15A therein is supported and aligned with emitter 11B immediately below the tip of emitter 11B. Extractor ring 15 is at the same potential as element 13A of electrostatic optical system 13 in the described embodiment of the invention, and can be physically attached to element 13A if desired.

Asymmetric electrostatic lens system 13 includes top element 13A, center element 13C, and bottom element 13F.

A first element 13A is a disk-shaped conductor having a circular aperture 13B. Aperture 13B is centered about beam axis 19, and first element 13A is perpendicular to axis 19. Aperture 13B has a diameter D, which is three millimeters in the described embodiment of the invention. The thickness of first element 13A is designated by t', and is equal to one millimeter.

A second element 13C is physically asymmetric, and is spaced a distance S from first element 13A, S being three millimeters in the described embodiment of the invention.

The above mentioned physical asymmetry results from an aperture of varying diameter through second element 13C. The upper portion 13D of second element 13C has a thickness t and an aperture diameter of D, t being three millimeters. The lower portion 13E of second element 13C has a vertical thickness of 14 millimeters and an aperture diameter of D', which is 18 millimeters in the described embodiment of the invention. The ratio of the aperture diameter D' to the thickness of lower portion 13E, therefore is 18 millimeters divided by 14 millimeter, or 1.3. The precise ratio of the large diameter of the middle lens element to the small diameter thereof is not important, as long as the ratio is greater than approximately 3.5 to 1. It is important, however, that no portion of the bottom lens element 13F extend into the enlarged aperture of the middle element in order to obtain the low chromatic aberration coefficient that is so desirable.

A beam limiting aperture 13G is positioned between elements 5 and 13A.

A third element 13F is parallel to first element 13A, and is spaced S millimeters therefrom. Third element 13F has a thickness t' and an aperture diameter of D. First, second and third elements 13A, 13C and 13F are all axially aligned with respect to axis 19. It should be noted that the above dimensions of the described embodiment of the invention are exemplary, but not critical. These dimesions were used in devising the curves shown in the various drawings attached hereto, and can be varied by those skilled in the art to produce varying optical characteristics for the electrostatic optical system 13.

Electrostatic deflection system 21 is disposed below third element 13F in FIG. 1 and is axially aligned with axis 19. A voltage $V_E$ is applied to the emitter.

An initial or first voltage V1 is applied to first element 13A by means of feedthrough 17A. Voltage V1 is also applied to extractor ring 15 in the device of FIG. 1 and to element 13G. A control voltage V2 is applied to center element 13C by means of feedthrough 17E.

A third or final voltage V3 is applied to bottom element 13F by means of feedthrough 17C. V1, V2 and V3 are all referenced to the voltage VE of the electron source 11. In usual configurations, V3 would be set at ground potential and the final energy of the beam would then be determined by $V_E$. The extraction voltage is determined by the difference between $V_E$ and V1.

Feedthrough 17D is employed to apply suitable voltage to the deflection plates of electrostatic deflection system 21.

Before discussing the operation and advantage of the system of FIG. 1, it should be understood that the amount of current in a focused beam is approximately proportional to the square of the angular acceptance of the lens system. The angular acceptance is the angle which the beam makes with the central axis 19 of the lens system as the emitted beam travels from the virtual source into the first element 13A of the system. The chromatic aberration (which, as mentioned above, is the limiting factor in reducing the spot size into which the beams having large energy spreads can be focused) is proportional to the angular acceptance of the lens system. The angular acceptance is determined by aperture 13G.

Consequently, if the chromatic aberration of the lens system can be reduced, the same spot size can be obtained with an increased angular acceptance. This, of course, greatly increases the beam current which can be focused by the lens system onto the spot (since the beam current is approximately proportional to the square of the angular acceptance).

In discussing the operation and advantages of the system shown in FIG. 1, the following symbols are used and are defined below:

Symbols List $dI/d\Omega$ angular intensity (Amperes sr$^{-1}$)
f focal length (mm)
F focal position (mm)
$C_s$ spherical aberration coefficient (mm)
$C_c$ chromatic aberration coefficient (mm)
M magnification
$\nu$ aperture half angle subtended (radians)
E field emission voltage (volts)
$\Delta E$ beam energy spread (volts)

The system shown in FIG. 1 combines a physically asymmetric, voltage asymmetric, electrostatic optical system with a TFE electron source. We have found that this system is capable of providing a very high beam current into a smaller spot than any prior microprobe or gun for beam energies in the intermediate range of roughly 1–30 kilovolts and for acceleration ratios of $0.2 < V_3/V_1 < 6$. (For purposes of calculation it is convenient to set the emitter voltage $V_E = 0$ and the extraction voltage is then equal to V1. In this case, voltage V3, which is set at ground potential in an actual system, is set not equal to zero. Thus, for purposes of calculation the final beam energy is numerically equal to V3.) The TFE source is capable of providing a bright, reliable beam having an angular intensity $dI/d\Omega$ of up to approximately $10^{-3}$ amperes per steradian. (Note that the term "angular intensity" is commonly used by those skilled in art to indicate the intensity of a charged particle beam emanating from a small source. Its units are amperes per steradian). According to the present invention, a significant portion of this beam current can be focused onto a spot having a diameter of approximately 0.1 microns.

Figure 2A:
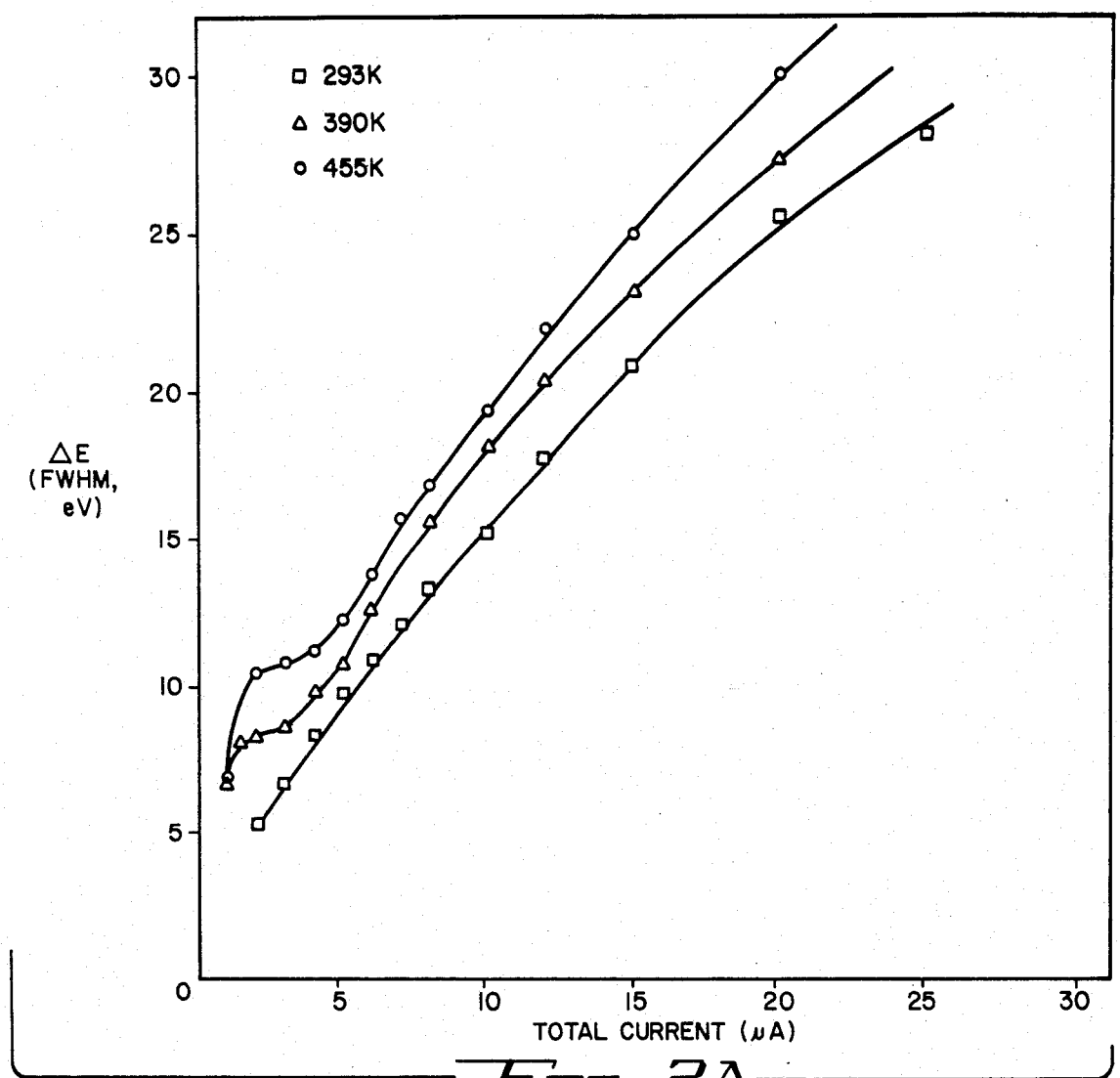
FIG. 2A is a graph showing the variation of ion beam energy spread as a function of total beam current and emitter temperature for a liquid gallium emitter.
Figure 2B:
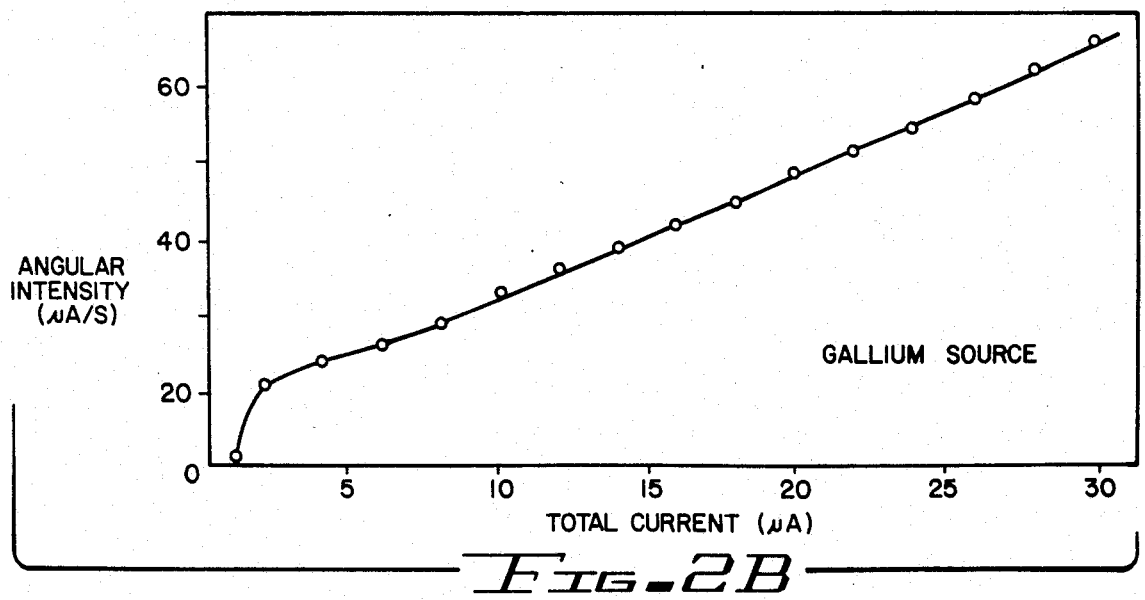
FIG. 2B is a graph showing beam angular intensity as a function of total beam current for liquid gallium emitter.

As previously mentioned, TFE electron sources frequently quently have high energy spreads at angular intensities of the order of $10^{-3}$ amperes per steradian as indicated in FIG. 8B. Field ionization sources, of course, have even higher energy spreads at angular intensities in the range of $10^{-5}$ to $10^{-4}$ amperes per steradians (see FIG. 8A and also FIG. 2B). Therefore, for ion guns with liquid metal field ionization sources, and for TFE electron sources, the effect of chromatic aberration of an accelerating or decelerating electrostatic lens system is critical, and is the limiting factor in determining the spot size.

Investigations have been made recently on the properties of some extremely bright thermal-field electron (TFE) sources, the results of which show that attention must be paid to the chromatic aberration of the gun as well as to the spherical aberration. Also, with increasing interest in field ionization (FI) sources for the production of submicrometer focused ion beams, more emphasis must be placed on low-chromatic aberration lenses. Thus, in view of the fact that TFE emitters operated at very high current levels can have an energy spread of $\Delta E$ of 0.5–1.5ev, and possibly much more with liquid ion sources, lens with low chromatic aberration are of considerable importance.

In accordance with the present invention, we have determined that the physically asymmetric, voltage asymmetric, electrostatic lens system shown in the system of FIG. 1 has lower chromatic aberration than any other known electrostatic lens system operating at comparable voltage ratios.

Two computer programs written by Munro were used to calculate the potential distribution in the optical properties of the lens. The programs were modified slightly in order to be able to run them on a CDC-6400 computer. The first program calculates the axial potential in the lens by means of the finite-element method with boundary conditions determined by the lens geometry. For each calculation the axial potential was plotted to make sure that the parameters chosen to represent the lens did not result in unphysical behavior, such as infinite second derivates of the axial potential. The second program was used to find trajectories and optical properties by integrating the ray equation with the calculated axial potential.

The chromatic aberration $C_c$ of an electrostatic optical system can be calculated in accordance with the following expression:

$$C_c = K \int_{Z_o}^{Z_i} \left( \frac{1}{2} \frac{V'}{V^{\frac{3}{2}}} \frac{r'}{r} + \frac{1}{4} \frac{V''}{V^{\frac{3}{2}}} \right) r^2 dz$$

In the above expression, V is the axial potential along axis z, and its first and second derivatives with respect to z are V' and V'', respectively. The constant of proportionality K is a function of $V_1$ and M (M is the magnification of the electrostatic lens system). r is the off-axis distance of the beam trajectory. z is axial distance along the axis 19 of the lens system. Primes denote differentiation with respect to the axial distance z.

We have shown that for the case wherein the beam emanates from a point source near the focal point of the lens, the slope of trajectory (r') will be greatest and r will be least at the entrance of the lens. We have found that r will be greatest and r' least for the exit end of the lens.

In order to minimize the chromatic aberration $C_c$, it is necessary to maintain V″ at as small a value as possible toward the exit side of the lens and to confine the region where r' is large. However, it is also desirable to have a large value for V' at the lens entrance in order to minimize spherical aberration.

We have found that utilizing small values of r near the lens entrance and a relatively short distance over which V' and r' are large prevents the chromatic aberration $C_c$ from becoming too large. We have found that when the electrostatic lens system of FIG. 1 is operated in the "acceleration" mode, the axial potential V decreases gradually with axial distance after achieving its maximum value near the front of the lens. This behavior is desirable to minimize chromatic aberration.

In the infinite magnification case (collimated beam), we have found that the axial potential for the above described lens system rises rapidly at the front of the lens and falls at an approximately constant rate towards the rear of the lens. This is due to the small aperture diameter at the front end of the lens and the large aperture diameter on the axis at the rear end of the lens.

FIG. 6, which is a graph of the axial potential V of the lens system of FIG. 6, shows the above-mentioned approximately constant rate of decrease of V (and hence, the small value of the second derivative V″) towards the exit side of the lens.

Our calculations show that when it is desirable to work with a relatively low energy beam, the asymmetric three-element lens system has a very substantial advantage over prior two-element lens systems. We have found that for beam accelerating ratios and from approximately 0.2 to 6, the physically asymmetric voltage, asymmetric electrostatic lens system, due to its low chromatic aberration, is more useful in focusing beam sources with large beam energy spreads at intermediate beam energies in the range from 1-30 kilovolts than any prior electrostatic lens system.

FIG. 4 shows a plot of computed values of the spherical aberration coefficient $C_s$, chromatic aberration coefficient $C_c$, focal length f, and focal position F for the three-element asymmetrical lens system of FIG. 1 as a function of focus voltage ratio $V_2/V_1$ for the case $V_1 = 5kV$ and $V_3 = 10kV$.

For further detail, see our paper "An Asymmetric Electrostatic Lens for Field Emission Microprobe Applications", Journal of Applied Physics, Vol. 50, April, 1979, and "A Study of Some Electrostatic Gun Lenses for Field Emission", presented at the "Scanning Electron Microscopy" Symposium April 16-18, 1979, and published in the proceedings of that Symposium in July, 1979. Both of these papers are incorporated herein by reference.

The superiority of the asymmetric three-element lens system over a conventional two-element lens system is shown in FIG. 5, which shows spot size plotted against angular acceptance and for various acceleration ratios for both types of lens systems.

The physically asymmetric, voltage asymmetric lens system of FIG. 1 has proven to be exceptionally suitable for multiplying or dividing the initial beam energy by small factors, in the range from roughly 0.2 to 6.

Figure 3:
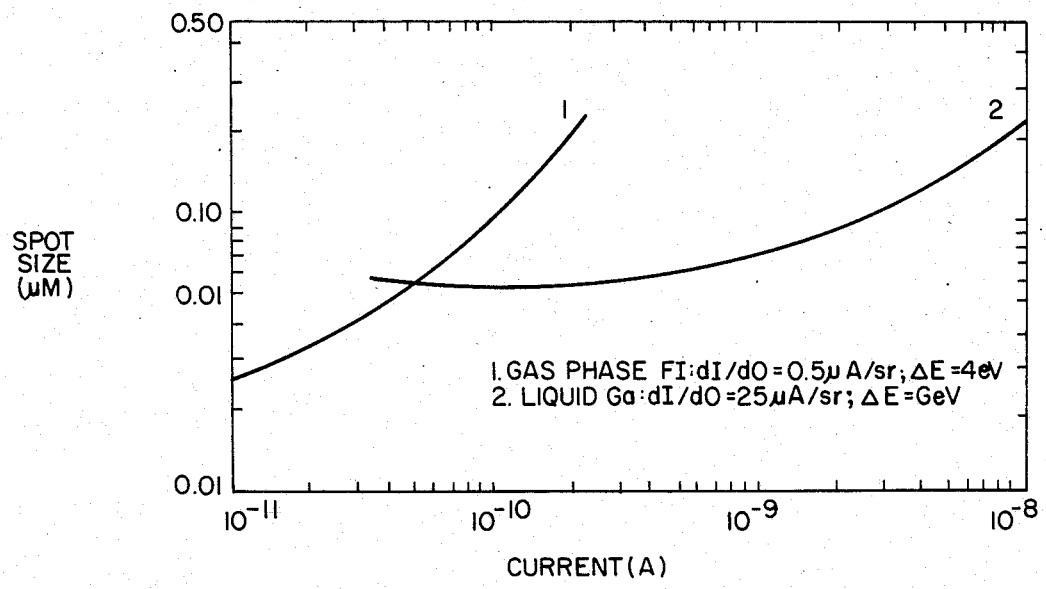
FIG. 3 is a graph useful in comparing gas phase and liquid phase gallium emitters.

It is noteworthy that the three-element lens system can have its control voltage varied without varying the object distance. FIG. 3 illustrates that the liquid gallium ionization source delivers a beam of approximately 30 times the current density of a beam of the same size delivered by a gas phase field ionization source, and a gas phase hydrogen field ionization source.

Figure 7:
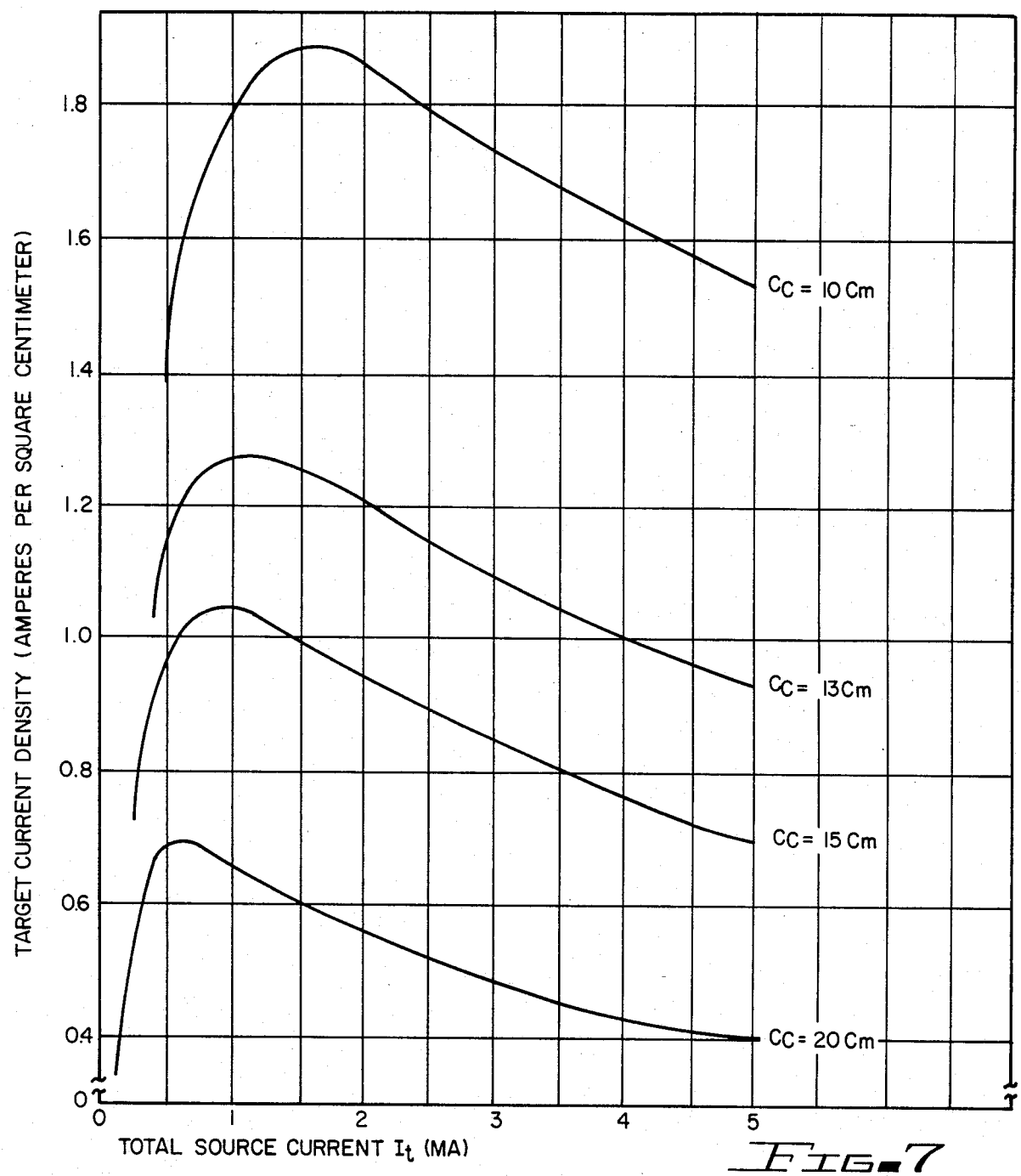
FIG. 7 is a graph showing a family of curves illustrating target current density versus total source current for a gallium liquid ion beam source beam focused with electrostatic lens systems having a range of chromatic aberration coefficients, showing the importance of chromatic aberration.

FIGS. 8A and 8B disclose the relationship between energy spread and angular intensity in ion beams and electron beams, respectively, emanating from bright sources. These two graphs show that for both bright ion beam sources and bright electron beam sources in the having angular intensities in the range of interest, the energy spread ΔE increases rapidly as the angular intensity increases. Since the deleterious effects of chromatic aberration rapidly increase as ΔE increases, it is essential that the electrostatic lens system used with such a bright, high angular intensity FI or TFE source have very low chromatic aberration if small spot sizes are desired. (For further information on the relationship between E and angular intensity of TFE and FI sources, see "Total Energy Distributions of Field-Emitted Electrons at High Current Density", *Physical Review* B, Volume 19, Number 7, page 3353, Apr. 1, 1979 and "Measurement of the Energy Distribution of a Gallium Liquid Metal Ion Source", *Journal of Applied Physics*, Volume 51, Number 7, page 3453, July, 1980, both of the foregoing articles being incorporated herein by reference.) FIG. 7 shows a group of computed curves indicating target current density versus total ion source current for electrostatic lens system having chromatic aberration coefficients in the range from 10 to 20 centimeters. These curves show that as the $C_c$ varies from 10 to 20 there is a dramatic decrease in the target current density. These curves also show that there is a limited range in which optimum current density can be obtained from the ion source. This is because as the total source current is increased, the energy spread increases rapidly (as indicated by FIG. 8A), and the effect of chromatic aberration increases rapidly, decreasing current density as total source current increases. For example, for gallium at 293° K., $\Delta E = 4 \times 10^4 (I_t)^{0.7} eV$. Thus, it is clear that the current density can't be increased by simply operating the ion source at higher total current levels. Attempts to increase ion current density on the target area, for example, by decreasing the acceptance angle or increasing the angular intensity, simply won't work for the ion or electron sources of the kind mentioned above. The foregoing general conclusion is also true for TFE electron sources, even though the relationship of increasing ΔE with increasing beam current or increasing angular intensity is not exactly the same for TFE sources as for FI sources.

In accordance with another aspect of the present invention, the asymmetric lens system described with reference to FIG. 1, when used with a liquid metal ion source, is used to initially "visualize" the surface of an integrated circuit. The surface of the integrated circuit, in this event, is the target 9 mounted on arm 7 of FIG. 1, and is hereinafter also designated by reference numeral 9. Integrated circuit 9 is mounted in a dual-in-line package (DIP) having its cover removed, thereby exposing the top surface of integrated circuit 9. Briefly, after visualization of the surface of integrated circuit 9, a small area hole is sputtered through the passivation layer to expose an underlying metal conductor. The integrated circuit 9 then is moved to another device which includes the apparatus shown in FIG. 1 with a TFE source, instead of an FI (field ionization) source, and the voltage contrast scanning electron microscopy (VCSEM) technique is used to determine the potential of that conductor.

The purpose of this embodiment of the invention is to utilize the above mentioned voltage contrast technique to accurately, non-intrusively determine the potential or voltage on certain conductors of the integrated circuit. The dual-in-line package of the integrated circuit is inserted into a socket which is incorporated in arm 7. A plurality of electrical conductors connected to the various pins of the socket (not shown) into which integrated circuit 9 is plugged are designated by reference numeral 37, and pass through the wall of the vacuum chamber to a circuit designated by reference numeral 39. Circuit 39 includes a circuit for "exercising" certain inputs of integrated circuit 9. Block 39 also includes suitable power supplies for applying electrical power to the power leads of integrated circuit 9. The power supply circuit can be readily implemented by any conventional power supply that delivers the power supply voltages required by the integrated circuit 9. The exerciser circuit could be a complex, programmable device programmed to exercise the inputs of integrated circuit 9 in a particular way, or it could be a very simple circuit such as a Tektronix square wave generator, which is what we used in our experiments.

In this embodiment of the invention, the integrated circuit 9 is first "visualized" by means of an ion gun described previously. Scanning of the ion beam across the surface of the integrated circuit chip is accomplished by means of beam deflection circuitry 31, which is connected by means of conductors 33 and 35 passing through feedthroughs 17E and 17D, respectively to deflection plates 21B and 21A, respectively, in order to cause the ion beam to controllably scan the X and Y directions across the surface of the integrated circuit 9. It should be understood that the diagramatic representation shown in FIG. 1 is not entirely accurate; note that the beam deflection circuitry provides the necessary potential difference between the two X deflection plates 21B and the two Y deflection plates 21A to accomplish the desired X-Y beam scanning. Beam deflection circuitry 31 can be obtained from FEI company of Hillsboro, Oregon, and is designated as their Model 83-01 Beam Deflection Circuit.

A secondary electron collector represented by reference numeral 41 is located adjacent to integrated circuit 9 and receives secondary electrons that are emitted by the surface of integrated circuit 9 as a result of its surface being bombarded by the ions in the scanning ion beam. Secondary electron collecting device 41 can be a device sold under the trademark CHANNELTRON by the Galileo Electro-Optics Company of Massachusetts. It produces an output on conductor 43, which is amplified by a conventional video amplifier 45, and which is applied thereby to the intensity control input of an oscilloscope 47. Thus, if oscilloscope 47 is scanned in synchronization with X and Y scanning signals produced by beam deflection circuitry 31 by means of a synchronization signal on conductor 49, the image of the surface of integrated circuit 9 appears on the CRT display of oscilloscope 47.

As previously explained, metal conductors on the surface of integrated circuit 9 having differing voltages thereon emit secondary electrons having different energies. Furthermore, a shift in the voltage of a particular conductor during the ion beam scanning results in a corresponding shift in the energy of the secondary electrons emitted thereby, and hence a shift in the brightness of the image that conductor as it appears on the CRT screen of oscilloscope 47. Variations in the input voltages applied to control inputs of integrated circuit 9 (by means of the exerciser circuit in block 39) produce such varying shifts in the voltage of, and hence the brightness of the images of certain conductors on the surface of integrated circuit 9 as those images appear on the CRT screen.

In most instances of electron beam testing of VLSI circuits (very large scale integrated circuits), an apprximately one micron thick insulating glass passivation layer coats the integrated circuit chip. (This layer can, however, be from 1000 to 30,000 angstroms thick). Although quantitative VCSEM (voltage contrast scanning electron microscopy) can be performed with the passivation layer present, results can be distorted by cross-coupling of signals from adjacent circuit elements, quantitative VCSEM can only be performed at high voltages, greater than approximately 15 kilovolts, such that the electron beam penetrates the passivation layer. Also note that only AC voltage contrast above approximately ten hertz can be thus viewed, as the voltage signal affecting or modulating secondary electron emission at the surface of the passivation layer is capacitively, not directly coupled from the metal conductor to the surface of the passivation layer. Furthermore, the scanning electron beam charges up the outer surface of the passivation. For MOS circuits, this presents difficulty due to circuit malfunctions that are caused by electron beam induced effects (especially on the potential of MOS gates that are electrically floating at certain times during circuit operation or on shifts in MOS threshold voltages). If the passivation layer is not removed, the electron beam must be kept at approximately 1 KeV energy to avoid charging of the passivation layer. This is a severe constraint on the operation of a scanning electron microscope. Accurate quantitative low voltage VCSEM can be performed if the passivation layer can be removed at circuit "test points", in accordance with the present invention. In our experiments, we have arrived at a means of removing small amounts of the passivation layer at such test points in selective areas by means of submicron ion beams which are produced by the previously described ion gun shown in FIG. 1. In order to sputter an area several microns square of the one micron thick passivation layer within a few minutes time, an ion beam current density of greater than approximately 0.1 amperes per square centimer is required. As previously explained, the ion gun version of the device shown in FIG. 1 achieves this ion beam current density, using a liquid metal ion source.

Figure 9:
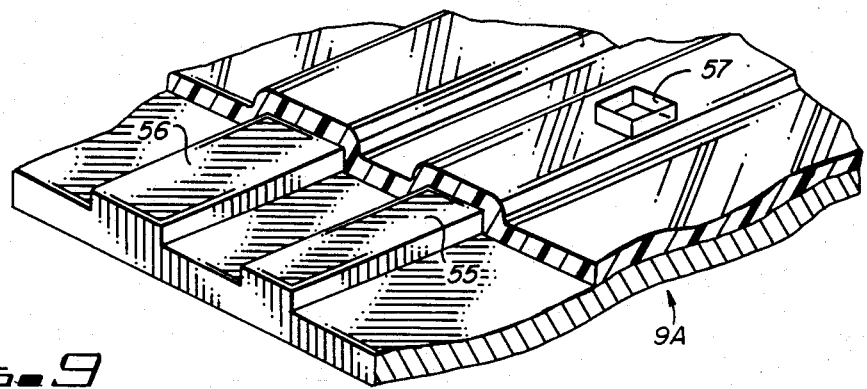
FIG. 9 is a perspective view of a surface portion of an integrated circuit subjected to the passivation milling technique of the present invention.

Because of the low conductivity of the passivation layer of the integrated circuit 9, the passivation layer charges positively during ion bombardment, forming a layer of charge on the passivation. This layer of charge modifies the energy of the emitted secondary electrons, making it very difficult to obtain accurate values of the potential of the underlying metal conductor. Nevertheless, a scanning ion image of the surface topography of the integrated circuit 9 can be observed, as shown in FIG. 9, which is a diagram showing the surface of the integrated circuit. Referring briefly to FIG. 9, reference numeral 9A represents a small portion of the surface area. Reference numeral 55 designates a metal conductor on the top surface of integrated circuit 9, and reference numeral 56 designates another metal conductor. These metal conductors are covered with approximately one micron (10,000 angstroms) of electrically insulating glass passivation material. Reference numeral 57 designates a small square opening approximately 4 microns square which was milled by the above mentioned ion beam by rapidly scanning it across the four micron square area of the passivation layer directly overlying metal conductor 55. A 12 kilovolt scanning beam of gallium ions from the previously mentioned gallium liquid metal ion source require only approximately three minutes to "mill" the passivation all way down to the underlying metal conductor 55, at area 57, at which point a very high number of secondary electrons are emitted immediately upon removal of the last traces of the passivation layer. At this point, a very bright spot corresponding to area 57 appears on the surface of the CRT screen of oscilloscope 65, since a fairly large number of secondary electrons are emitted and collected by CHANNELTRON collector 41, greatly increasing the intensity of the image of conductor 55 on the CRT 47. The high secondary electron yield from the metal under the milled area 57 occurs as a result of the lack of positive electric strong extraction field for secondary electrons over the metal as compared with the electric field brought about by the positively charged passivation layer, assuming that the conductor 55 is electrically grounded during the passivation milling operation. This serves the useful purpose of signaling completion of the removal of the passivation layer. This result also suggests the possibility of using ion beam induced secondary electrons to carry out voltage contrast measurements, although in our experiments we moved integrated circuit 9 to a different device, namely an electron microscope having essentially the same apparatus as shown in FIG. 1, except that the source is a TFE source, rather than a liquid metal ion source. If the source is a TFE source, the voltages V1, V2 and V3 of FIG. 1 are of approximately the same magnitude as in the case where an ion source is used, but are of opposite polarity.

In our experiments, TFE emitter 11B was formed of 100 single crystal tungsten having a chemically etched tip with a radius of several thousand angstroms. During operation it is operated at approximately 1800° Kelvin. Alternately and preferably, the single crystal tungsten material can be doped with zirconium, which lowers the work function of the <100>plane at the end of the emitter tip. These two types of tungsten emitters are the most common TFE emitters, and are well known in the art. Alternately, as described in the above-mentioned co-pending application, reference numeral 11 can designate a field ionization source wherein tungsten emitter 11B can be coated with liquid metal, such as gallium, in which case the tungsten emitter 11B can be fabricated from 127 micron diameter drawn tungsten wire. In any event, the emitter 11B is spot welded to a 177 micron tungsten loop 11A through which current is forced to resistively heat the emitter 11B. The energy of the electron beam was approximately 2.5 keV (kilo-electron volts), and its angular intensity is approximately $10^{-3}$ amperes per steradian.

The exerciser circuit 39 of the ion gun was actuated to apply digital input signals to the integrated circuit 9, which in this case was an integrated circuit quad NOR gate. A five volt power supply was used, and the exerciser circuit was simply a Tektronix five volt square wave generator. The image of the portion of the integrated circuit surface indicated in FIG. 9, with conductor 55 at +5 volts, resulted in the milled passivation region 57 appearing as a very dark spot, the remaining portions of the integrated circuit surface appearing to be very bright. However, when the potential of the metal conductor 55 was caused to be zero volts, many secondary electrons escaped through the milled hole 57 in the passivation in FIG. 9. This resulted in a very bright image appearing at passivation hole 57 when conductor 55 was at zero volts.

It should be noted that normally when low frequency, less than 10 hertz signals are applied to the metal conductor 55, the voltage contrast image decays due to charge of the passivation layer by the electron beam. However, in the milled region 57, no decay of the voltage contrast image was observed even for DC signals. This result has caused us to conclude that the selective area removal of the passivation layer from high brightness liquid metal ion sources, focused by the three element electrostatic lens system described above can be economically used to eliminate passivation charging problems that have normally been associated with voltage contrast scanning electron microscopy measurements. Because of the limited mean free path of low voltage metal ions in solids, disruption of any device electrical characteristics, such as MOS gate potentials and MOS threshold voltages, should be minimal. This embodiment of the invention avoids the need to carefully select electron energies of the scanning electron beam so as to cause the number of secondary electrons emitted by the passivation surface to equal the number of electrons of the scanning beam striking the passivation surface in order to avoid charging of the surface of the passivation layer.

Various devices, known as electron energy analyzers, are known for use in VCSEM and VCSSEM applications. See FIG. 3 in the related descriptive material in "The Role of Field Emission in Submicron Electron Beam Testing", an article which has been accepted for publication in the journal "Thin Solid Films", is incorporated herein by reference. Such electron energy analyzers can be used to obtain accurate quantitative measurements of the potentials of the metal conductor, if the energies of the emitted secondary electrons themselves have not been distorted by passivation charging.

While the invention has been described with reference to several particular embodiments thereof, those skilled in the art will be able to make various modifications to the disclosed apparatus and method without departing from the true spirit and scope of the invention. For example, it is not necessary to put the ion gun and electron gun in separate vacuum chambers; a means of moving integrated circuit 9 from the ion gun target region to the electron gun can be provided. It is, of course, practical to use a well known electron energy analyzer to obtain quantitative measurements of the potential of the metal conductor in addition to or instead of the qualitative representation thereof by the relative brightness of the image of metal conductor 55 appearing on the CRT screen. Conductor 55 can, of course be metal, or doped polycrystaline silicon, or any other conductor.

We claim:

1. An apparatus for producing a high current beam of electrons along an axis and focusing said beam onto a small target spot, said apparatus comprising in combination:

(a) pointed emitter means for emitting said beam along said axis, said beam having an angular intensity of up to approximately $10^{-3}$ amperes per steradian;

(b) an electrostatic lens system spaced from and disposed about said axis beneath said pointed emitter means for focusing said beam onto said target spot, said electrostatic lens system including (i) a first lens element conducting a first voltage and including a first disc having therein a first aperture through which said beam passes, said first aperture being circular and centered about said axis;

(ii) a second lens element conducting a second voltage and including a second aperture through which said beam passes after it leaves said first aperture, said second lens element being spaced from and disposed beneath said first lens element, said second aperture having an upper portion which is circular, and is centered about said axis, and has a first diameter, said second aperture having a lower portion which is approximately cylindrical, and is centered about said axis, and has a second diameter, and has a predetermined thickness in the direction of said axis, said second diameter being substantially greater than said first diameter, said second diameter being approximately 1.3 times as great as said predetermined thickness, and (iii) a third lens element located entirely below said second aperture and conducting a third voltage and having a third aperture through which said beam passes only after it leaves said second aperture, said third aperture being circular and centered about said axis, said second lens element producing an approximately constant rate of reduction in the magnitude of the potential along said axis in said lower portion of said second aperture in order to reduce the chromatic aberration caused by said electrostatic lens system.

2. The apparatus of claim 1 wherein the diameter of said first aperture and the diameter of said upper portion of said second aperture are approximately equal in magnitude.

3. The apparatus of claim 2 wherein a thickness of said first lens element, and a thickness of said upper portion of said second aperture, and a spacing between said first and second lens elements are approximately equal in magnitude.

4. The apparatus of claim 1 wherein said beam has an energy spread of at least 0.5 electron volts.

5. The apparatus of claim 1 wherein said first and second discs are flat and parallel to each other and wherein said second lens element has a flat upper surface which is parallel to said first and second discs and wherein said second lens element has a bottom surface which is parallel to said first and second discs.

6. The apparatus of claim 5 wherein the diameter of said first aperture is approximately 3 millimeters, the diameter of said upper portion of said second aperture is approximately 3 millimeters, the diameter of said lower portion of said second aperture is approximately 18 millimeters, said predetermined thickness is approximately 14 millimeters, the spacing between said first disc and said flat upper surface of said second lens element is approximately 3 millimeters, and the spacing between the bottom surface of said second lens element and said second disc is approximately 3 millimeters.

7. A method of producing a high current beam of electrons and focusing said beam onto a small target spot, said method comprising the steps of:

(a) applying an emitter voltage to a pointed emitter to cause said pointed emitter to emit a beam of electrons along an axis, said beam having an angular intensity of up to approximately $10^{-3}$ amperes per steradian;

passing said beam along said axis through a first aperture disposed in a first lens element after said beam leaves said pointed emitter, said first lens element having a first voltage thereon;

(c) passing said beam along said axis through a first portion of a second aperture disposed in a second lens element, said first portion of said second aperture having a first diameter, said second lens element having a second voltage thereon, and also passing said beam along said axis directly from said first portion of said second aperture into and through a second portion of said second aperture, said second portion of said second aperture having a second diameter that is substantially greater than said first diameter and said second portion of said second aperture extending a predetermined distance along said second axis, said second diameter being approximately 1.3 times as great as said predetermined distance in order to produce an approximately constant rate of reduction in the magnitude of the potential along said axis in said second portion of said second aperture to thereby reduce the chromatic aberration caused by said second lens element;

(d) passing said beam along said axis through a third aperture that is disposed in a third lens element, said third lens element being spaced a predetermined distance from said second portion of said second aperture, said third lens element having a third voltage thereon; and (e) passing said beam along said axis from said third aperture to said target spot.

8. A voltage contrast scanning microscopy method comprising the steps of:

(a) causing a beam of ions to be emitted from an ionization source with a high angular intensity;

(b) focusing said beam of ions onto the surface of an integrated circuit having a plurality of conductors covered by an electrically insulative passivation layer, said focusing step comprising:

(i) passing said beam of ions along an axis through a first aperture disposed in a first lens element after said beam of ions leaves said pointed emitter, said first lens element having a first voltage thereon;

(ii) passing said beam of ions along said axis through a first portion of a second aperture disposed in a second lens element, said first portion of said second aperture having a first diameter, said second lens element having a second voltage thereon, and also passing said beam of ions along said axis directly from said first portion of said second aperture into and through a second portion of said second aperture, said second portion of said second aperture having a second diameter that is substantially greater than said first diameter and said second portion of said second aperture extending a predetermined distance along said second axis, said second diameter being approximately 1.3 times as great as said predetermined distance in order to produce an approximately constant rate of reduction in the magnitude of the potential along said axis in said second portion of said second aperture to thereby reduce the chromatic aberration caused by said lens element;

(iii) passing said beam of ions along said axis through a third aperture that is disposed in a third lens element, said third lens element being spaced a predetermined distance from said second portion of said second aperture, said third lens element having a third voltage thereon; and (iv) passing said beam of ions along said axis from said third aperture through a deflecting device to said surface of said integrated circuit;

(c) causing said beam of ions to repetitively scan over a predetermined relatively small area of said passivation layer lying directly over a first one of said conductors, for a sufficiently long time to sputter away enough passivation material within said area to produce a hole through the passivation layer exposing the underlying portion of said first conductor, the size of said area sputtered away being sufficiently large to avoid the charging of said passivation layer by a beam of electrons, such charging causing substantial modification of energies of secondary electrons emitted by said exposed first conductor in response to said beam of electrons;

(d) causing a beam of electrons to be emitted from a thermal field electron source with a high angular intensity;

(e) focusing said beam of electrons onto the surface of said integrated circuit to cause emission of secondary electrons, the energies of which are accurately indicative of the potential of the portion of said surface upon which the electrons of said beam presently are impinging; and (f) collecting at least a portion of said secondry electrons and producing a first electrical signal indicative of the potential of said first conductor, the area of the exposed portion of said first conductor being essentially equal to said relatively small area, said relatively small area being large enough to prevent charging of the surface of the passivation layer around said hole that would undesirably distort the emission of said secondary electrons.

9. The method of claim 8 including passing said beam of electrons through a lens system similar to the one through which said beam of ions is passed.

* * * * *